United States Patent [19]
Goff

[11] Patent Number: 5,148,124
[45] Date of Patent: Sep. 15, 1992

[54] MONOLITHIC MICROWAVE INTEGRATED CIRCUIT NOISE GENERATOR AND VARIABLE RESISTANCE DEVICE

[75] Inventor: Miles E. Goff, Carlisle, Mass.

[73] Assignee: Lockheed Sanders, Inc., Nashua, N.H.

[21] Appl. No.: 771,271

[22] Filed: Oct. 3, 1991.

[51] Int. Cl.$^5$ .......................... H01P 1/22; H01C 7/13; H03B 29/00; H03B 3/16
[52] U.S. Cl. ...................................... 331/78; 219/209; 333/247; 333/263; 338/23
[58] Field of Search .................. 331/78; 333/247, 253, 333/263; 338/23, 24; 219/209

[56] References Cited
U.S. PATENT DOCUMENTS
4,808,009 2/1989 Sittler et al. ...................... 338/23 X Primary Examiner—Siegfried H. Grimm
Attorney, Agent, or Firm—David W. Gomes

[57] ABSTRACT

A monolithic microwave integrated circuit device provides a microwave transmission line with a resistor coupled thereto and a heating element thermally coupled to the resistor but electrically insulated therefrom by a dielectric layer. Heating the resistor with the heating element causes either a change in resistance of the resistor or the generation of noise by the resistor. Either the resistor or the heating element is constructed using monolithic integrated circuit construction techniques on the same circuit substrate with the transmission line.

20 Claims, 2 Drawing Sheets

MONOLITHIC MICROWAVE INTEGRATED CIRCUIT NOISE GENERATOR AND VARIABLE RESISTANCE DEVICE

BACKGROUND OF THE INVENTION

1. Field of the Invention

This invention generally relates to monolithic microwave integrated circuit devices and, in particular, to such devices which may be used as noise sources and as variable resistors.

2. Statement of the Prior Art

Noise sources are typically used in the fabrication and testing of microwave systems, such as receivers, for the purpose of determining the amounts of additional noise generated within such systems. Existing noise sources generally take the form of avalanche noise diodes carried in waveguide mounts which may be connected to different types of microwave circuitry (waveguide, stripline, MMIC) by the use of appropriate physical couplers. As useful as these known devices have been, they are still less suitable for more modern microwave systems which have tended towards higher frequencies and smaller component and circuit sizes. Existing devices are especially excluded from built-in-test (BIT) applications because of the physical differences in the circuit types.

SUMMARY OF THE INVENTION

Accordingly, it is the purpose of the present invention to provide a microwave noise source in a monolithic integrated circuit format suitable for use in performing built-in-test functions for such circuits.

In one form, the device of the present invention provides a monolithic integrated circuit substrate, a microwave transmission line formed on the substrate, semiconductor resistor means formed in the substrate and electrically coupled to the transmission line, an electrically insulating dielectric layer deposited over the semiconductor resistor means, an integrated circuit heating element formed on top of the dielectric layer and in sufficiently close proximity to the semiconductor resistor means to be thermally coupled thereto through the dielectric layer, and means for applying electrical energy to the heating element for causing the semiconductor resistor means to either produce a noise signal or change its resistance value.

In another form, the device of the present invention provides a monolithic integrated circuit substrate, a microwave transmission line including a series connected resistor means, the transmission line being formed on the substrate, a semiconductor heating element formed in the substrate and located beneath the resistor means for coupling heat thereto, an electrically insulating dielectric layer located over the semiconductor heating element and beneath the resistor means, and means for applying electrical energy to the semiconductor heating element, wherein the resistor means is formed over the dielectric layer in sufficiently close proximity to the semiconductor heating element to be thermally coupled thereto through the dielectric layer, for producing either a noise signal in the transmission line or a change in the resistance of the resistor means in response to the application of heat thereto from the semiconductor heating element.

BRIEF DESCRIPTION OF THE DRAWINGS

The present invention is illustratively described in reference to the accompanying drawings of which.

DETAILED DESCRIPTION OF THE DRAWINGS

Figure 1:
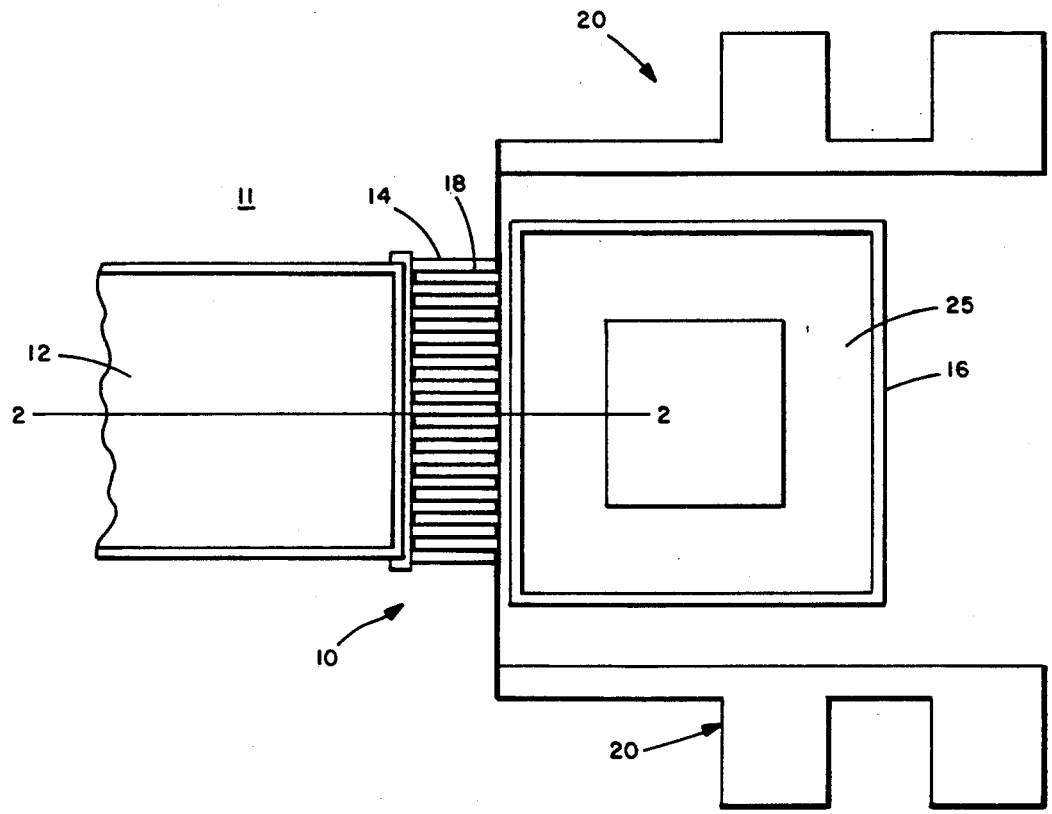
FIG. 1 is an enlarged top plan view of a portion of a monolithic integrated circuit including a microwave device constructed in accordance with one embodiment of the present invention.
Figure 2:
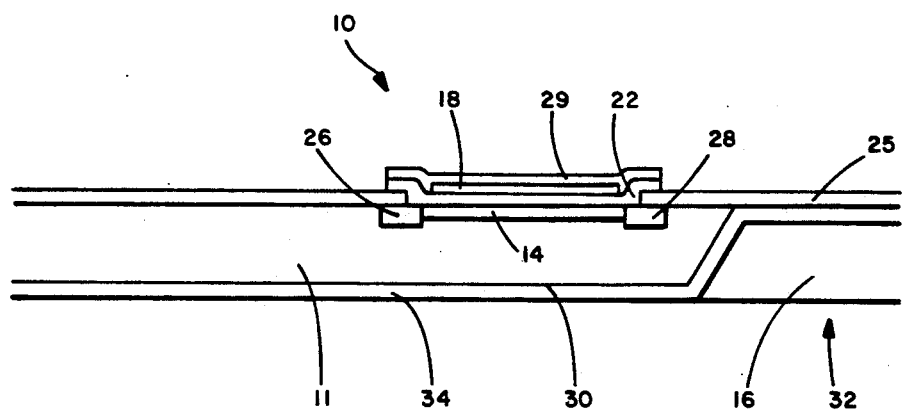
FIG. 2 is a cross-sectional view of the integrated circuit device of FIG. 1 taken along view lines 2—2.

FIGS. 1 and 2 show a monolithic microwave integrated circuit device 10 generally including a semiconductor element or resistor 14 which is heated by a heating element 18 for the purpose of either generating noise signals or varying the resistance of resistor 14. The device 10 may be coupled to other circuitry by a transmission line 12. Semiconductor resistor 14 may take the form of any suitably heatable, microwave resistance which in this embodiment is an ion implanted gallium arsenide, GaAs, bulk resistor. Transmission line 12 is a standard gold microstrip line, nominally (96) microns wide. Semiconductor resistor 14 is constructed to have both the same width and the same impedance, in this case (50) ohms, as transmission line 12 for the purpose of impedance matching the device 10 to other circuitry. The other end of resistor 14 is connected to ground, typically through a via 16 to the back plane of the substrate on which transmission line 12 is constructed. This electrically couples the device 10 between the transmission line 12 and ground.

Located primarily on top of resistor 14 in FIG. 2 is a dielectric layer 22. Dielectric layer 22 is formed from silicon nitride and is nominally (0.275) microns thick. The dielectric 22 is shown in FIG. 2 but not in FIG. 1 for purposes of clarity in depicting the alignment of the other elements.

On top of the dielectric layer 22, there is formed a heating element 18 in the form of a thin film metal strip. Heating element 18 is constructed to meander back and forth across the maximum amount of area of semiconductor resistor 14 to achieve the maximum amount of thermal coupling possible therewith. Element 18 is also constructed to have a minimal cross-sectional area to raise its resistance. It constitutes a resistive heating element. In one embodiment the heating element 18 is (1.0) micron wide and built over a resistor 14 which is (96) microns wide and (34) microns long. The strip is made of (0.05) microns of platinum on top of (0.05) microns of titanium.

Heating element 18 is also arranged symmetrically with respect to the electromagnetic field produced by any microwave energy within transmission line 12 and semiconductor resistor 14. This provides self-cancellation of any microwave energy coupled to the heating element 18 and thereby prevents any uncontrolled heating effects therefrom and provides electrical isolation between the heating and microwave circuits.

Also included with heating element 18 are a pair of metal bonding pads 20 for coupling electrical power thereto for the purpose of producing heat.

FIG. 2 shows a cross-section of the device 10 of FIG. 1 taken along view lines 2—2. This cross-section is discussed below in conjunction with the processing steps used for construction of the embodiment. The basic principles of the monolithic construction process are well known as evidenced by the book *Monolithic Microwave Integrated Circuits,* edited by Robert A. Pucel, 1985, IEEE Press. The specific steps used in constructing the present embodiment are as follows:

1. The top surface of the GaAs substrate 11 is first polished and cleaned.

2. The top of substrate 11 is then subjected to ion implantation of silicon atoms to reduce the intrinsic resistivity of the gallium arsenide to a value more suitable for the formation of a semiconductor element.

3. The substrate 11 is then thermally annealed to repair crystal lattice damage and to achieve the appropriate activation of the implanted material. The heating is controlled to yield the desired sheet resistance for semiconductor resistor 14 which will provide a (50) ohm resistance.

4. A layer of photoresist is applied to the surface and then patterned and developed to cover the area which will become semiconductor resistor 14 and to expose the remainder of the surface. The exposed area is subjected to ion implantation of boron which raises the resistivity of the exposed substrate back to almost its intrinsic level and thereby isolates resistor 14. The photoresist is then cleaned off.

5. Another layer of photoresist is applied and then patterned and developed to expose the areas which will become ohmic contacts 26,28 for resistor 14.

6. Ohmic contacts 26,28 are formed on the exposed substrate using gold, germanium and nickel and a suitable metal deposition technique such as electron beam evaporation.

7. The photoresist is removed, and the ohmic contacts are suitably sintered to form low resistance electrical connections to the semiconductor resistor 14.

8. Another layer of photoresist is applied to the surface and then patterned and developed to expose the areas which are to become the transmission line 12, metal bonding pads 20, and the topside catch pad 25 for the via 16.

9. First metal layers of titanium, tungsten, and gold are deposited on the entire substrate including the photoresist and areas not covered by the photoresist.

10. The first metal layers are then removed using a metal liftoff technique in which a solvent is employed to float off the metal on top of the photoresist and leave metal adhered to the substrate forming the basis for transmission line 12, metal bonding pads 20 and the topside catch pad 25.

11. A thin layer of a dielectric 22, such as silicon nitride, is then deposited over the entire substrate using a plasma enhanced chemical vapor deposition technique.

12. A layer of photoresist is then applied to the dielectric 22 and suitably patterned and developed to expose the dielectric covering the first metal layers previously deposited.

13. The dielectric material covering the metal is then removed using a standard, reactive ion etching process to reveal the metal.

14. The photoresist is then cleaned from the surface leaving a layer of silicon nitride dielectric 22 protecting areas including the semiconductor resistor 14.

15. A new layer of photoresist is then applied and suitably patterned and developed to expose all areas where thick plated metal is desired, in particular transmission line 12, metal bonding pads 20 and catch pad 25.

16. A plating interconnect layer of metal is applied and the wafer is electroplated with gold to form thick layers required for transmission line 12, metal bonding pads 20, and catch pad 25.

17. The substrate is cleaned, and another layer of photoresist is applied and suitably patterned and developed in the shape of the heating element 18.

18. The surface is then covered with a thin film of titanium followed by a thin film of platinum using standard thin film metal deposition procedures.

19. The photoresist and the metal on top of it are then lifted off by the application of a suitable solvent leaving the thin films of titanium and platinum adhered to the dielectric layer 22 over the semiconductor resistor 14 in the meandered pattern of element 18 shown in FIG. 1.

20. The surface is cleaned, and another layer of silicon nitride dielectric 29 is applied to serve as a passivation layer for the thin film metal of heating element 18.

21. A layer of photoresist is applied and patterned and developed to expose areas of the dielectric 29 where no passivation layer is desired. These areas include metal bonding pads 20, transmission line 12, and catch pad 25.

22. The dielectric layer 29 is then removed from undesired areas using reactive ion etching techniques.

23. The substrate 11 is next thinned by precision grinding of the backside 30 while the topside of the wafer is protected from damage.

24. The backside 30 is then patterned and developed to expose an area for via 16, which area is then etched to create a hole 32 extending through to the topside catch pad 25.

25. The processing of the wafer is completed by applying titanium and gold to form the ground plane layer 34 on the backside of the substrate 11. This layer 34 connects to the topside catch pad 25 to complete the ground connection of via 16.

Figure 3:
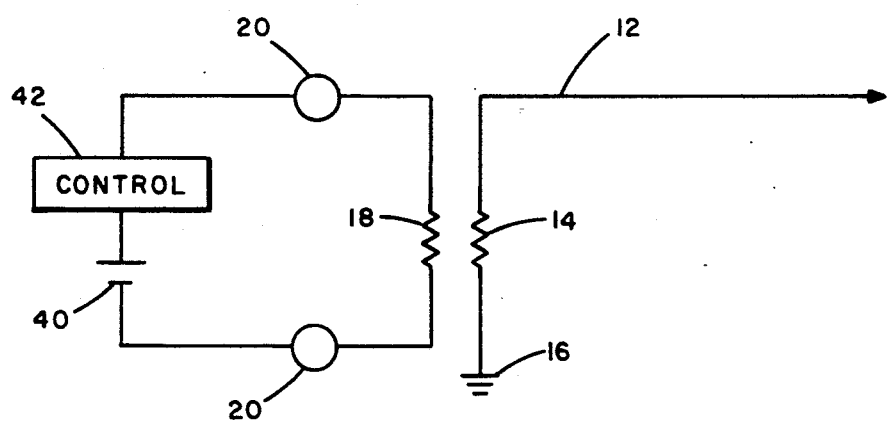
FIG. 3 is a schematic diagram of the embodiment of FIGS. 1 and 2.

FIG. 3 shows a schematic diagram of the embodiment of FIGS. 1 and 2 in which the same reference numerals are used to refer to the schematic representation of physical elements described above. In general, the heating element 18 and semiconductor resistor 14 are shown as resistance elements. Transmission line 12 is connected to one end of resistor 14 while the via ground connection 16 is connected to the other end. For the purposes of producing heat in the element 18, bonding pads 20 are used to connect element 18 to a source of DC voltage 40 and a control member 42. Control member 42 regulates the amount of DC voltage across heating element 18. Any suitable DC voltage source and control system may be used provided that signals other than DC, which might cause interference on transmission line 12 or the generation of uncontrolled noise, are not coupled to the heating element 18.

The device 10 of the present invention as described herein is functional as either a noise source or as a variable resistor. Raising the temperature of the resistor 14 serves to inject noise into the transmission line 12 and also to raise the resistance of resistor 14.

The present invention allows a noise source or variable resistor to be constructed which is compatible with monolithic microwave integrated circuitry (MMIC) and fabrication techniques.

The noise generation function is electrically isolated from the heat source for preventing uncontrolled noise signals from being introduced to a circuit under test. The broadband impedance matching of the transmission line and the noise generation resistance means that almost all of the noise power generated is coupled to the transmission line. For example, the embodiment described above provides a return loss to the transmission line of greater than 20 db over the frequency range of DC to 40 Ghz. This means that over 99% of the noise power is delivered to the transmission line over that vast frequency range.

The variable resistor form of the present invention allows adjustment of the resistance value over a range of more than (10) percent. This is accomplished without any undesirable changes in the reactance of the resistor. This is enabled by the isolation of the heating energy input.

Figure 4:
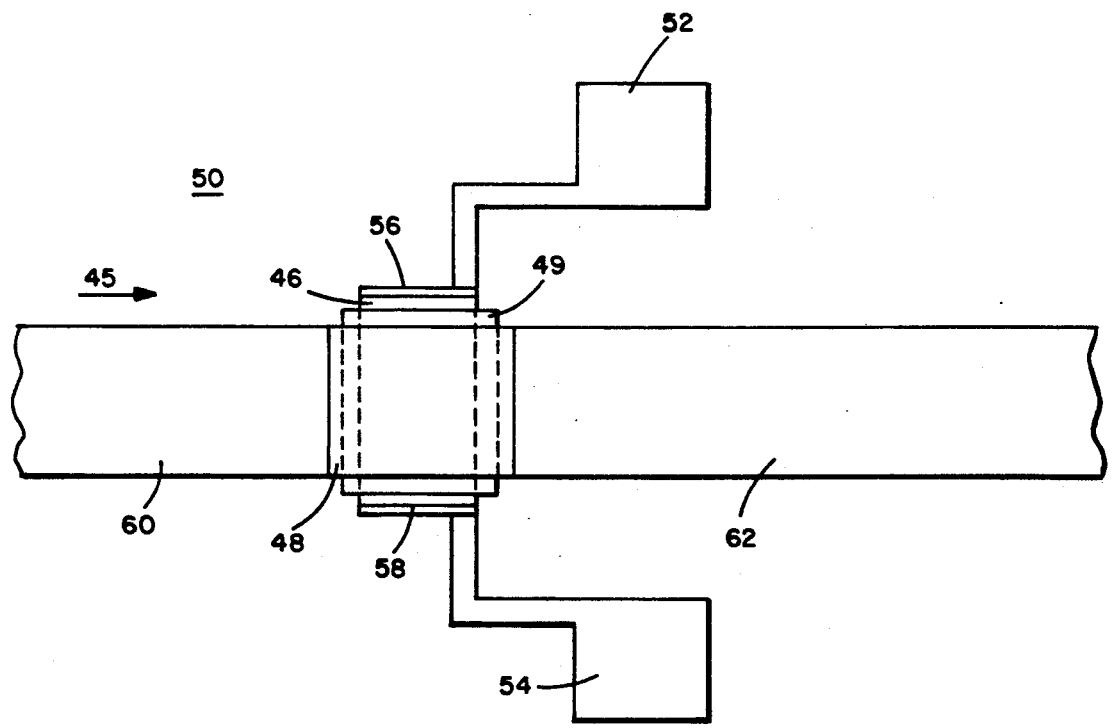
FIG. 4 is an enlarged top plan view of a portion of a monolithic integrated circuit device constructed in accordance with another embodiment of the present invention.

FIG. 4 shows another embodiment of the present invention generally including a semiconductor heating element 46 and a thin film microwave transmission line resistor 48. Semiconductor resistor 46 is constructed within a gallium arsenide substrate 50 as is the transmission line semiconductor element 14 of FIG. 1. Resistor 46 is connected to a pair of bonding pads 52,54 by means of a pair of ohmic contacts 56,58, respectively, for the purpose of allowing heat producing electric current to be applied thereto. The transmission line resistor 48 is connected to two sections 60,62 of a standard microwave transmission line. Also, the width and resistance of transmission line resistor 48 are matched to that of transmission line 60,62 for the purpose of impedance matching.

The device 45 of FIG. 4 may be constructed in a manner very similar to that described for the device 10 of FIG. 1 The construction process would differ in that the steps of constructing semiconductor resistor 14 would be used to construct the heating element resistor 46 and the steps used for constructing the heating element 18 would be used for constructing the thin film transmission line resistor 48.

In operation, the device 45 may be serially connected within a transmission line as shown in any suitable circumstances in which either a noise source or variable resistor may be used.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. A monolithic microwave integrated circuit device for generating a noise signal, comprising:
   a monolithic integrated circuit substrate;
   a microwave transmission line formed on the substrate;
   semiconductor resistor means formed in the substrate and electrically coupled to the transmission line for producing a noise signal therein in response to the application of heat to the semiconductor resistor means;
   an electrically insulating dielectric layer deposited over the semiconductor resistor means;
   an integrated circuit heating element formed on top of the dielectric layer and in sufficiently close proximity to the semiconductor resistor means to be thermally coupled thereto through the dielectric layer; and
   means for applying electrical energy to the heating element for causing the semiconductor resistor means to produce a noise signal.

2. The device of claim 1, wherein the heating element is a thin film metal resistor deposited on the dielectric layer by integrated circuit techniques.

3. The device of claim 2, wherein the substrate is gallium arsenide and further wherein the semiconductor resistor means is formed by ion implantation of at least a portion of the gallium arsenide.

4. The device of claim 3, wherein the thin film metal resistor is formed with titanium and platinum.

5. The device of claim 4, wherein the dielectric layer is formed with silicon nitride or silicon oxide.

6. A monolithic microwave integrated circuit device for generating a noise signal, comprising:
   a monolithic integrated circuit substrate;
   a microwave transmission line including a series connected resistor means, the transmission line being formed on the substrate;
   a semiconductor heating element formed in the substrate and located beneath the resistor means for coupling heat thereto;
   an electrically insulating dielectric layer located over the semiconductor heating element and beneath the resistor means; and
   means for applying electrical energy to the semiconductor heating element, wherein the resistor means is formed over the dielectric layer in sufficiently close proximity to the semiconductor heating element to be thermally coupled thereto through the dielectric layer, for producing a noise signal in the transmission line in response to the application of heat thereto from the semiconductor heating element.

7. The device of claim 6, wherein the transmission line resistor means is a thin film metal resistor deposited on the dielectric layer by integrated circuit techniques.

8. The device of claim 7, wherein the substrate is gallium arsenide and further wherein the semiconductor heating element is formed by ion implantation of at least a portion of the gallium arsenide.

9. The device of claim 8, wherein the thin film metal resistor is formed with titanium and platinum.

10. The device of claim 9, wherein the dielectric layer is formed with silicon nitride or silicon oxide.

11. A monolithic microwave integrated resistor having an electrically variable resistance value, comprising:
    a monolithic integrated circuit substrate;
    a microwave transmission line formed on the substrate;
    semiconductor resistor means formed in the substrate and electrically coupled to the transmission line for providing an electrical resistance which is variable in response to the temperature thereof;
    an electrically insulating dielectric layer deposited over the semiconductor resistor means;
    an integrated circuit heating element formed on top of the dielectric layer and in sufficiently close proximity to the semiconductor resistor means to be thermally coupled thereto through the dielectric layer; and
    means for applying electrical energy to the heating element for causing the resistance of the semiconductor resistor means to change.

12. The device of claim 11, wherein the heating element is a thin film metal resistor deposited on the dielectric layer by integrated circuit techniques.

13. The device of claim 12, wherein the substrate is gallium arsenide and further wherein the semiconductor resistor means is formed by ion implantation of at least a portion of the gallium arsenide.

14. The device of claim 13, wherein the thin film metal resistor is formed with titanium and platinum.

15. The device of claim 14, wherein the dielectric layer is formed with silicon nitride or silicon oxide.

16. A monolithic microwave integrated circuit resistor having an electrically variable resistance value, comprising:

a monolithic integrated circuit substrate;

a microwave transmission line including a series connected resistor means, the transmission line being formed on the substrate;

a semiconductor heating element formed in the substrate and located beneath the resistor means for coupling heat thereto;

an electrically insulating dielectric layer located over the semiconductor heating element and beneath the resistor means; and means for applying electrical energy to the semiconductor heating element, wherein the resistor means is formed over the dielectric layer in sufficiently close proximity to the semiconductor heating element to be thermally coupled thereto through the dielectric layer, for causing variation of the resistance of the resistor means in response to the application of heat thereto from the semiconductor heating element.

17. The device of claim 16, wherein the transmission line resistor means is a thin film metal resistor deposited on the dielectric layer by integrated circuit techniques.

18. The device of claim 17, wherein the substrate is gallium arsenide and further wherein the semiconductor heating element is formed by ion implantation of at least a portion of the gallium arsenide.

19. The device of claim 18, wherein the thin film metal resistor is formed with titanium and platinum.

20. The device of claim 19, wherein the dielectric layer is formed with silicon nitride or silicon oxide.

* * * * *